(12) United States Patent
Chung et al.

(10) Patent No.: US 9,240,479 B1
(45) Date of Patent: Jan. 19, 2016

(54) THREE DIMENSIONAL SEMICONDUCTOR INTEGRATED CIRCUIT HAVING GATE PICK-UP LINE AND METHOD OF MANUFACTURING THE SAME

(71) Applicant: SK hynix Inc., Gyeonggi-do (KR)

(72) Inventors: Isaac Chung, Gyeonggi-do (KR); Jin Ha Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/856,082

(22) Filed: Sep. 16, 2015

Related U.S. Application Data (62) Division of application No. 14/303,359, filed on Jun. 12, 2014, now Pat. No. 9,166,015.

(30) Foreign Application Priority Data

Mar. 31, 2014 (KR) ........................ 10-2014-0037800

(51) Int. Cl.
| | |
|---|---|
| *H01L 21/8247* | (2006.01) |
| *H01L 23/528* | (2006.01) |
| *H01L 29/78* | (2006.01) |
| *H01L 27/24* | (2006.01) |
| *H01L 29/423* | (2006.01) |
| *H01L 27/088* | (2006.01) |
| *H01L 21/768* | (2006.01) |
| *H01L 23/48* | (2006.01) |
| *H01L 27/105* | (2006.01) |

(52) U.S. Cl.
CPC .......... *H01L 29/7827* (2013.01); *H01L 27/088* (2013.01); *H01L 27/2454* (2013.01); *H01L 29/42376* (2013.01); *H01L 21/76802* (2013.01); *H01L 21/76883* (2013.01); *H01L 21/76897* (2013.01); *H01L 23/481* (2013.01); *H01L 27/1052* (2013.01)

(58) Field of Classification Search
CPC ................... H01L 21/76802; H01L 21/76883; H01L 21/76897; H01L 23/481; H01L 27/1052
USPC ......................................... 257/684, 698, 724
See application file for complete search history.

(56) References Cited

U.S. PATENT DOCUMENTS

| | | | | |
|---|---|---|---|---|
| 2011/0039381 A1* | 2/2011 | Son | .................. | H01L 21/823431 438/268 |
| 2013/0052780 A1* | 2/2013 | Kim | .................. | H01L 21/76897 438/270 |
| 2014/0061750 A1* | 3/2014 | Kwon | .................. | H01L 27/1052 257/314 |
| 2014/0145238 A1* | 5/2014 | Mariani | .................. | H01L 29/74 257/107 |
| 2014/0252460 A1* | 9/2014 | Lee | ...................... | H01L 29/7827 257/330 |
| 2015/0255565 A1* | 9/2015 | Lee | ........................ | H01L 27/088 257/330 |

* cited by examiner

*Primary Examiner* — George Fourson, III
(74) *Attorney, Agent, or Firm* — IP & T Group LLP (57) ABSTRACT

A 3D semiconductor integrated circuit having a gate pick-up line and a method of manufacturing the same, wherein the semiconductor integrated circuit includes a plurality of active pillars formed in a gate pick-up region, buffer layers formed on the respective active pillars in the gate pick-up region, gates each surrounding an outer circumference of the corresponding active pillar and the corresponding buffer layer, and a gate pick-up line electrically coupled to the gates.

4 Claims, 8 Drawing Sheets

THREE DIMENSIONAL SEMICONDUCTOR INTEGRATED CIRCUIT HAVING GATE PICK-UP LINE AND METHOD OF MANUFACTURING THE SAME

CROSS-REFERENCES TO RELATED APPLICATION

This application is a division of U.S. patent application Ser. No. 14/303,359 filed on Jun. 12, 2014, which claims priority under 35 U.S.C. 119(a) to Korean application No. 10-2014-0037800, filed on Mar. 31, 2014. The disclosure of each of the foregoing application is incorporated by reference in its entirety as set forth in full.

BACKGROUND

1. Technical Field

Various embodiments of the present invention relate to a three-dimensional (3D) semiconductor integrated circuit and a method of manufacturing the same, and more particularly, to a 3D semiconductor integrated circuit capable of improving gate pick-up failures, and a method of manufacturing the same.

2. Related Art

With the rapid development of mobile and digital information communication and the consumer-electronic industry, studies on existing electronic charge controlled-devices may encounter limitations. To overcome the limitations, new functional memory devices having novel designs need to be developed. Particularly, next-generation memory devices with large capacities, ultra-high speed and ultra-low power need to be developed to satisfy demands of large capacity memories used in main information devices.

Resistive memory devices using a resistance material as a memory medium have been suggested as the next-generation memory devices, and typical examples of resistive memory devices are phase-change random access memories (PCRAMs), resistance RAMS (ReRAMs), or magnetic RAMS (MRAMs).

A resistive memory device may be typically formed of a switching device and a resistance device and may store data "0" or "1," according to a state of the resistance device.

A final target of the resistive memory devices is to improve integration density and to integrate as many memory cells as possible in a limited small area. In recent years, methods of forming the resistive memory devices into 3D structures have been also suggested, and there is a growing need for a method of stably stacking a plurality of memory cells having narrower line width.

A typical method of manufacturing a resistive memory device having a 3D structure includes a method of forming a switching device using a vertical pillar as a vertical channel layer.

The 3D channel structure having a vertical pillar, has a vertical surround gate. The vertical surround gate structure may be formed to surround a lower region of the pillar. The vertical surround gates may form a gate pick-up in a predetermined region. The gate pick-up line may be electrically contacted to the gate using a general contact process. Since the gate is formed to surround a circumference of a lower portion of the pillar, an over-etching process is used to form a contact hole (hereinafter, referred to as a gate pick-up hole) for forming the gate pick-up line.

However, when using the over-etching process, the contact hole may penetrate a substrate region (for example, source region) located below the pillar, and thus a short circuit between the gate pick-up line and the substrate portion (for example, source region) of the pillar, may be caused.

As described above, as the gate is formed to surround the circumference of the lower portion of the pillar, the contact hole for forming the gate pick-up line also has a depth approaching a height of the pillar. Therefore, an aspect ratio of the contact hole in which the gate pick-up line is formed is increased, and thus a void may occur in the gate pick-up line.

SUMMARY

According to an embodiment of the present invention, there is provided a semiconductor integrated circuit. The semiconductor integrated circuit may include a plurality of active pillars formed in a gate pick-up region, buffer layers formed on the respective active pillars in the gate pick-up region, gates each surrounding an outer circumference of the corresponding active pillar and the corresponding buffer layer, and a gate pick-up line electrically coupled to the gate.

According to an embodiment of the present invention, there is provided a semiconductor integrated circuit, wherein the semiconductor integrated circuit may include a semiconductor substrate having a cell array region and a gate pick-up region which include a plurality of pillars, respectively, buffer layers formed on the respective pillars included in the gate pick-up region, first gates formed on an outer circumference of the respective pillars included in the cell array region, second gates each surrounding an outer circumference of the corresponding pillar and the corresponding buffer layer included in the gate pick-up region, and a gate pick-up line electrically coupled to the second gates.

According to another embodiment of the present invention, there is provided a method of manufacturing a semiconductor integrated circuit. The method may include forming a buffer layer on a semiconductor substrate including a cell array region and a gate pick-up region, etching a predetermined portion of the buffer layer and the semiconductor substrate to form a plurality of pillars, forming first gates each surrounding a circumference of the respective pillars included in the cell array region, and second gates each surrounding a circumference of the respective pillars and the etched buffer layer included in the gate pick-up region, forming an insulating layer on the semiconductor substrate in which the first gate and the second gate are formed, forming a gate pick-up hole to expose the buffer layer and the second gates in the gate pick-up region, and filling a conductive layer in the gate pick-up hole to form a gate pick-up line.

These and other features, aspects, and embodiments are described below.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, various exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Embodiments according to the present invention are described herein with reference to cross-section and/or plan illustrations that are schematic illustrations of preferred embodiments of the present invention. However, embodiments of the present invention should not be limited construed as limited to the present invention. Although a few embodiments of the present invention will be shown and described, it will be appreciated by those of ordinary skill in the art that changes may be made in these exemplary embodiments without departing from the principles and spirit of the present invention.

Figure 1:
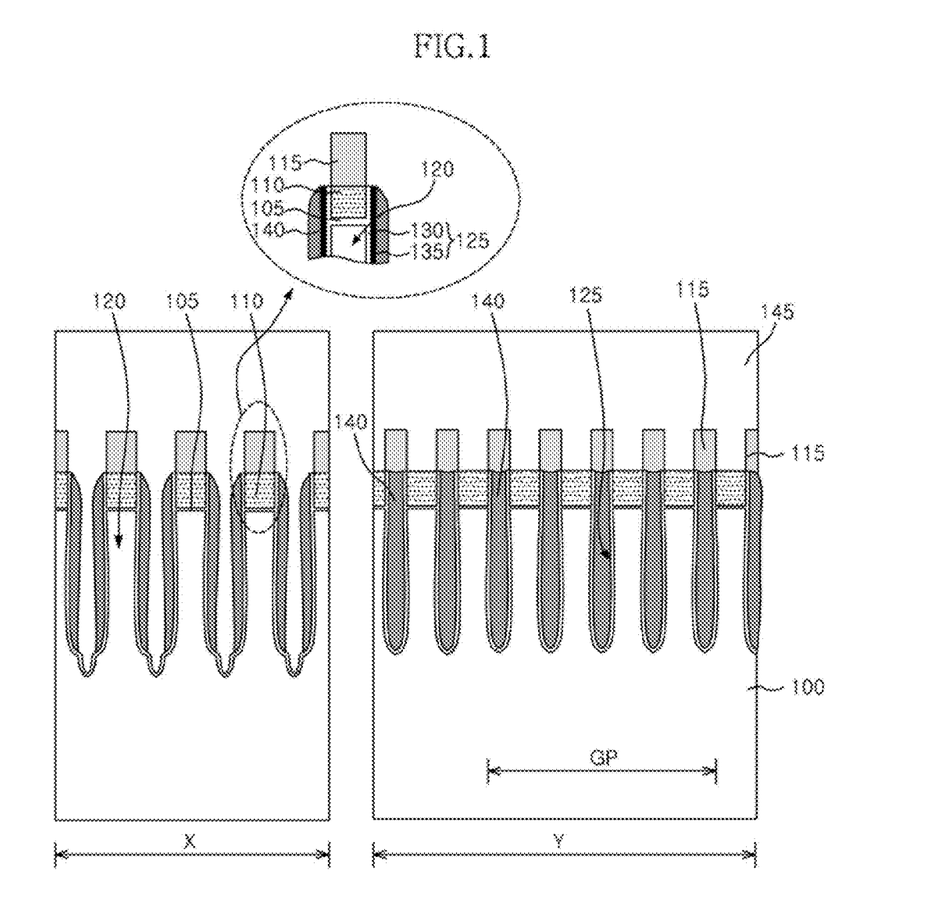
FIGS. 1 to 4 are cross-sectional views illustrating a method of manufacturing a semiconductor integrated circuit according to an embodiment of the present invention.

Referring to FIG. 1, a silicon oxide layer 105 and a buffer layer 110 are sequentially deposited on a semiconductor substrate 100. The semiconductor substrate 100 shown in FIG. 1 may be, for example, a cell array region including a gate pick-up region. An "X" region in FIG. 1 may illustrate a cross-section in a direction substantially perpendicular to an extending direction of a gate line to be formed later, and a "Y" region may illustrate a cross-section in a direction substantially parallel to the extending direction of the gate line. The buffer layer 110 may include a silicon nitride layer or a layer having etching selectivity to a silicon oxide layer. The buffer layer 110 may include a polysilicon layer. A hard mask pattern 115 for defining a pillar 120 is formed on the buffer layer 110. The hard mask pattern 115 may include, for example, a silicon nitride layer. The buffer layer 110, the silicon oxide layer 105, and the semiconductor substrate 100 are etched using the hard mask pattern 115 to form an active pillar 120. As an etching method for forming the pillar 120, an anisotropic etching method may be used. However, a sidewall of the pillar may have a taped form due to an aspect ratio of the pillar. The pillar 120 may be, for example, a junction region of a transistor, that is, a source and a drain.

A gate insulating layer 125 is covered on an outer wall of the active pillar 120 and an outer wall of the buffer layer 110. The gate insulating layer 125 may be formed of, for example, a dual layer including a silicon oxide layer 130 and a silicon nitride layer 135. The silicon oxide layer 130 may be formed, for example, through a thermal oxidation method.

A gate material layer 140 is formed to surround the pillar 120 on which the gate insulating layer 125 is covered. The gate material layer 140 may be formed of, for example, a conductive layer such as a Ti/TiN layer, but the gate material layer is not limited thereto. The gate material layer 140 in the X-direction may be shown to an outer wall spacer shape of the pillar 120. The gate material layer 140 in the Y-direction may be formed in a form to be filled in a space between pillars 120.

The semiconductor substrate 100 exposed by the gate material layer 140 is further etched to a certain depth in the X region. A gap-fill insulating layer 145 is formed to be sufficiently buried in the etched semiconductor substrate. The gap-fill insulating layer 145 may include, for example, a spin on dielectric (SOD) material. The gap-fill insulating layer 145 may penetrate the inside of the semiconductor substrate 100 between the pillars 120 to obtain sufficient node isolation.

Figure 2:
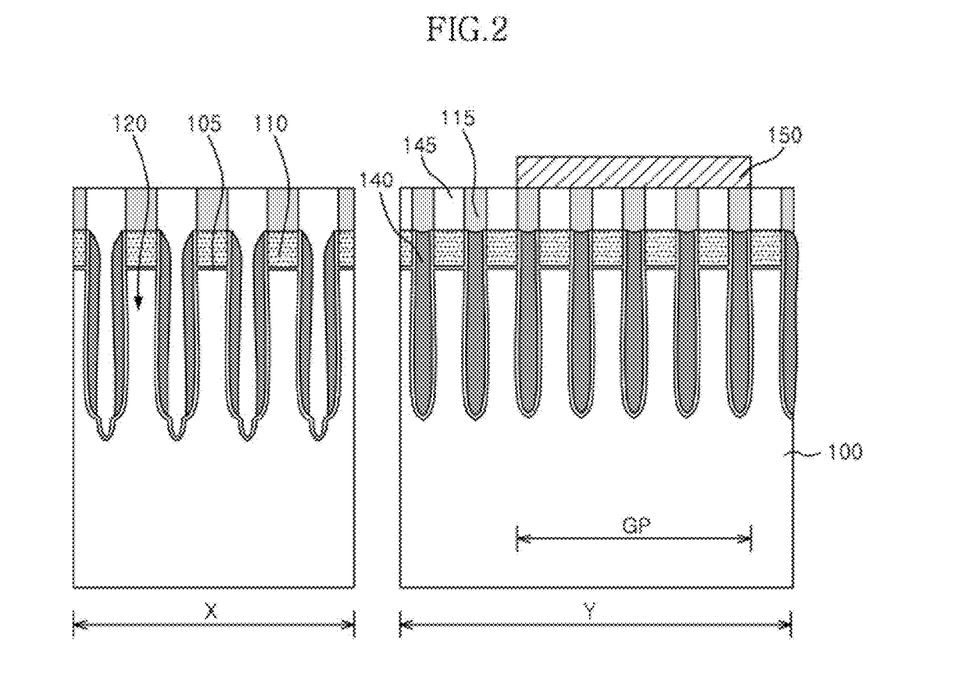

Referring to FIG. 2, the gap-fill insulating layer 145 is planarized until the hard mask pattern 115 is exposed. A mask pattern 150 is formed on a formed on a gate pick-up region GP in the Y region.

Figure 3:
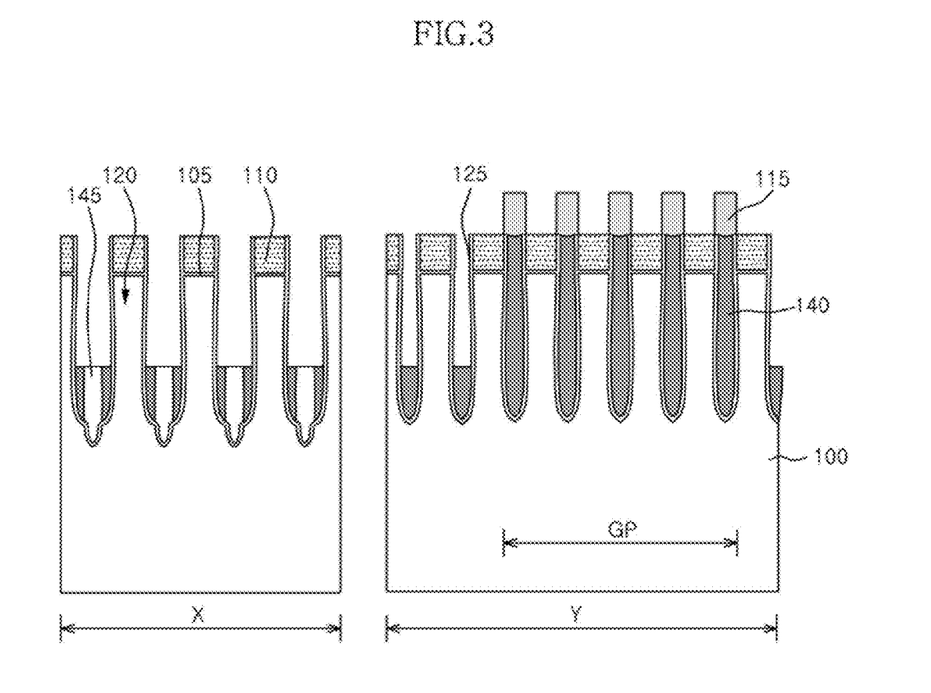

Referring to FIG. 3, the hard mask layer 115, the gap-fill insulating layer 145, and the gate material layer 140 of the cell array region other than the gate pick-up region GP are recessed to a certain depth using the mask pattern 150. After the mask pattern 150 is removed, the hard mask pattern 115 of the gate pick-up region GP is selectively removed.

The gate material layer 140 of the gate pick-up region GP may be left in a form to be buried in the entire space between the pillars 120, and the gate material layer 140 of the cell array region other than the gate pick-up region may be left in a lower portion of the space between the pillars 120. The gate is defined by the recess process.

Figure 4:
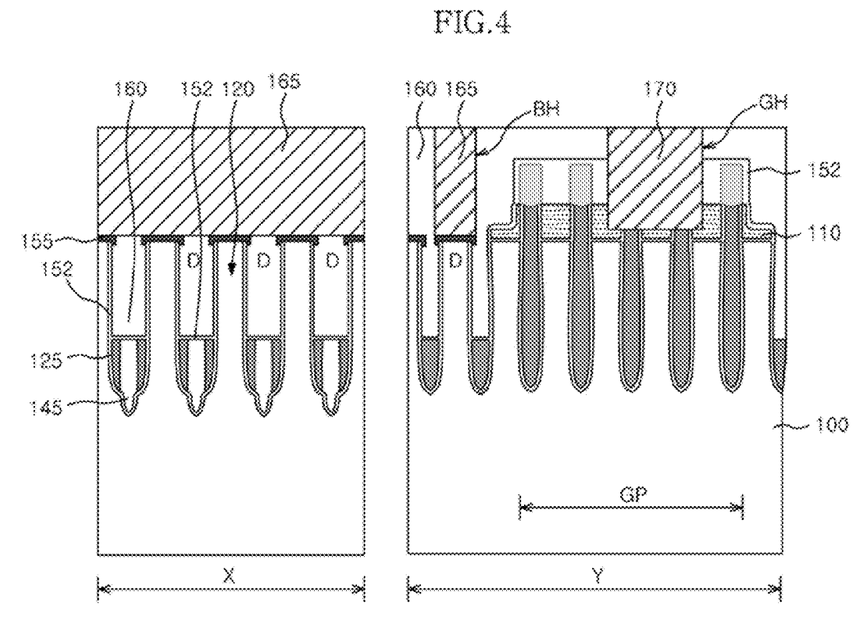

Referring to FIG. 4, a silicon oxide layer 152 is formed on an exposed gate material layer 140 shown in FIG. 3, and the gate pick-up region GP. The buffer layer 110 and the silicon oxide layer 105 shown in FIG. 3, of the cell array region other than the gate pick-up region are selectively removed. Thus, an upper region of the active pillar 120 may be opened. A drain D may be formed on the upper region of the active pillar 120 by an ion implantation. An ohmic layer 155 may be formed on the upper region of the active pillar 120 in which the drain D is formed. For example, the ohmic layer 155 may be formed to cover the upper region of the active pillar 120. The ohmic layer 155 may include, for example, a metal layer of Ti/TiN. However, the ohmic layer 155 is not limited thereto, and various conductive layers may be provided as the ohmic layer 155. An interlayer insulating layer 160 may be formed on the semiconductor substrate 100 in which the ohmic layer 155 is formed. The interlayer insulating layer 160 may include a plurality of insulating layers. For example, the interlayer insulating layer 160 in the space between the pillars 120 may be formed of a silicon nitride layer, and the interlayer insulating layer 160 other than the space may be formed of a silicon oxide layer.

The interlayer insulating layer 160 is etched to form a bit line hole BH and a gate pick-up hole GH. A conductive layer is buried in the bit line hole BH and the gate pick-up hole GH to form a bit line 165 and a gate pick-up line 170. The conductive layer constituting the bit line 165 and the gate pick-up line 170 may be formed of a barrier metal layer and a main metal layer.

Figure 5:
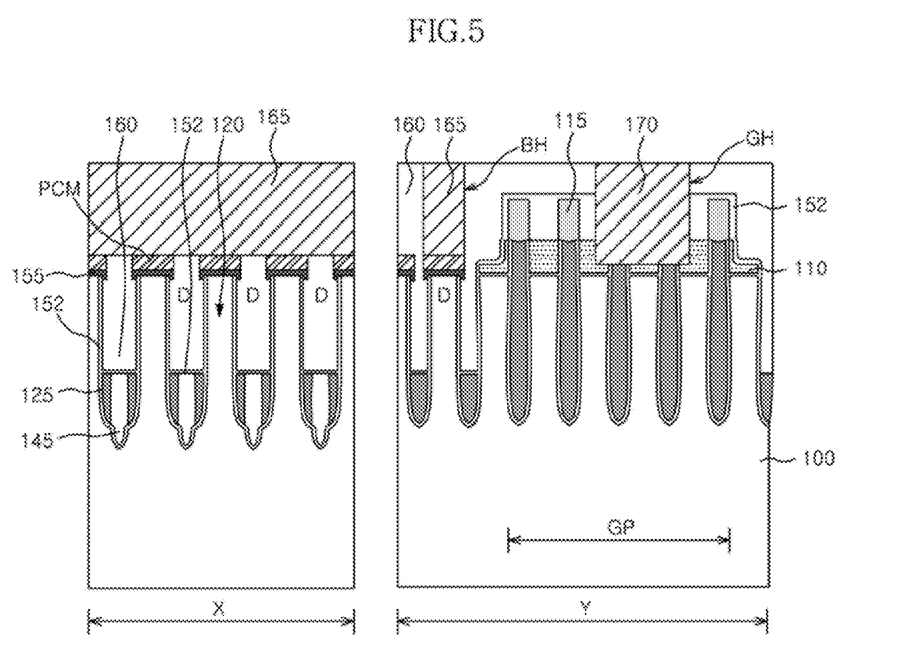
FIG. 5 is a cross-sectional view illustrating a semiconductor integrated circuit according to another embodiment of the present invention.

Referring to FIG. 5, a phase-change material layer PCM may be further interposed between the ohmic layer 155 and the bit line 165.

Since the gate pick-up hole GH and the bit line hole BH are substantially formed in the same process, the gate pick-up hole GH may not extend to the substrate 100, that is, to below the pillar 120, and is formed in the buffer layer 115 and the gate material layer 140 shown in FIG. 3. Therefore, a short circuit between the gate pick-up line 170 and the pillar 120, for example, between the gate pick-up line 170 and a common source line is prevented. Further, since an aspect ratio of the gate pick-up hole GH is reduced, the gate pick-up line 170 is easily filled.

Figure 6:
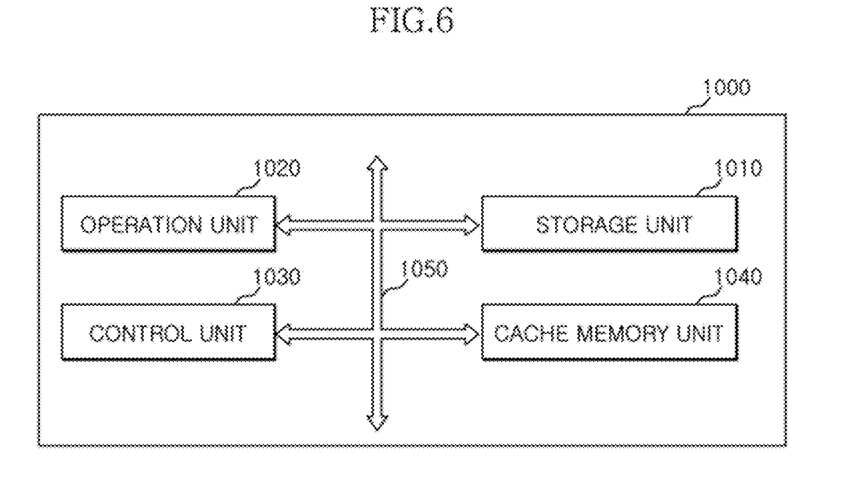
FIG. 6 is a block diagram illustrating a microprocessor according to an embodiment of the present invention.

As illustrated in FIG. 6, a microprocessor 1000 to which the semiconductor device according to the embodiment of the present invention is applied may control and adjust a series of processes, which receive data from various external apparatuses, process the data, and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may temporarily store data to be operated in the operation unit 1020, resulting data processed in the operation unit 1020, and an address in which the data to be operated on, is stored.

The storage unit 1010 may include one of the semiconductor devices according to embodiments of the present invention. The storage unit 1010 including the semiconductor device according to the above-described embodiment may have a structure in which a gate pick-up line is formed in a buffer layer without extension to the inside of a semiconductor substrate.

The operation unit 1020 may be a unit that may perform an operation in the microprocessor 1000, and perform a variety of four fundamental rules of an arithmetic operation or logic operations depending on a decryption result of a command in the control unit 1030. The operation unit 1020 may include one or more arithmetic and logic units (ALUs).

The control unit 1030 may receive a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 that may temporarily store data input from an external apparatus or data to be output to an external apparatus, other than the storage unit 1010. The cache memory unit 1040 may exchange data with the storage unit 1010, the operation unit 1020, and the control unit 1030 through a bus interface 1050.

Figure 7:
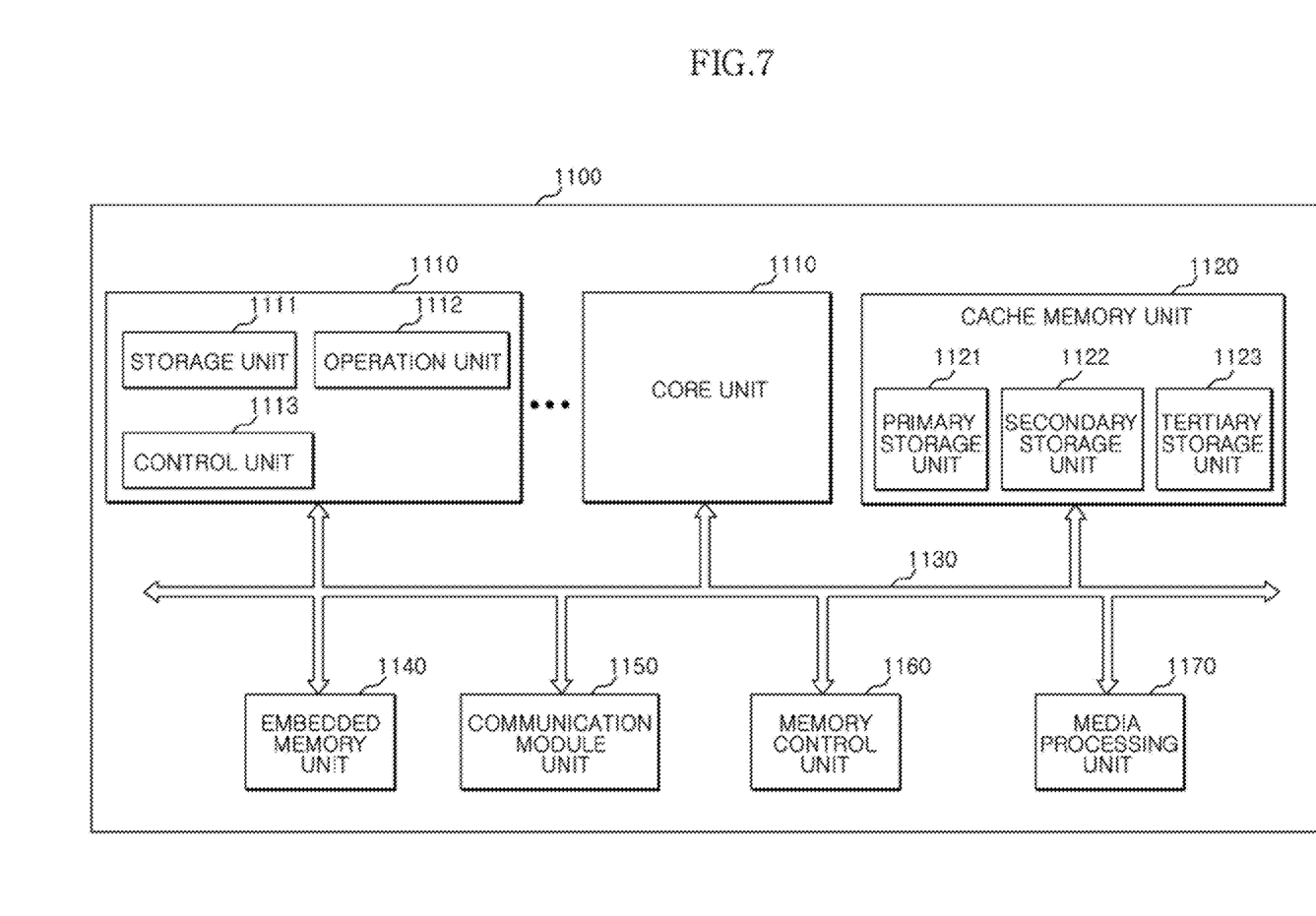
FIG. 7 is a block diagram illustrating a processor according to an embodiment of the present invention.

As illustrated in FIG. 7, a processor 1100 to which the semiconductor device according to the embodiment is applied may include various functions to implement performance improvement and multi-functions, in addition to the functions of the microprocessor that may control and adjust a series of processes, which receive data from various external apparatuses, process the data, and transmit processing results to the external apparatuses. The processor 1100 may include a core unit 1110, a cache memory unit 1120, and a bus interface 1130. The core unit 1110 in the embodiment according to the present invention may be a unit that may perform arithmetic and logic operations on data input from an external apparatus, and include a storage unit 1111, an operation unit 1112, and a control unit 1113. The processor 1100 may be a variety of system on chips (SoCs) such as a multi core processor (MCP) a GPU, or an AP.

The storage unit 1111 may be a processor register or a register, and the storage unit 1111 may be a unit that may store data in the processor 1100 and include a data register, an address register, and a floating point register. The storage unit 1111 may include various registers other than the above-described registers. The storage unit 1111 may temporarily store data to be operated in the operation unit 1112, resulting data processed in the operation unit 1112, and an address in which the data to be operated on, is stored. The operation unit 1112 may be a unit that may perform an operation in the processor 1100, and perform a variety of four fundamental rules of an arithmetic operation or logic operations depending on a decryption result of a command in the control unit 1113. The operation unit 1112 may include one or more arithmetic and logic units (ALUs). The control unit 1113 receives a signal from the storage unit 1111, the operation unit 1112, or an external apparatus of the processor 1100, performs extraction or decryption of a command, or input or output control, and executes a process in a program form.

The cache memory unit 1120 may be a unit that may temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is needed, the cache memory unit 1120 may include the tertiary storage unit 1123. The cache memory unit 1120 may include more storage units. That is, the number of storage units included in the cache memory unit 1120 may be changed according to design.

Processing rates of data storage and discrimination of the primary, secondary, and tertiary storage units 1121, 1122, and 1123 may be the same as or different from each other. When the processing rates of the storage units are different, the processing rate of the primary storage unit is the greatest. One or more of the primary storage unit 1121, the secondary storage unit 1122, and the tertiary storage unit 1123 in the cache memory unit 1200 may include one of the semiconductor devices according to the embodiments of the present invention. The cache memory unit 1120 including the semiconductor device according to the above-described embodiment may have a structure in which a gate pick-up line is formed in a buffer layer without extension to the inside of a semiconductor substrate. Further, FIG. 7 has illustrated that all the primary, secondary, tertiary storage units 1121, 1122, and 1123 are disposed in the cache memory unit 1120. However, all the primary, secondary, tertiary storage units 1121, 1122, and 1123 in the cache memory unit 1120 may be disposed outside the core unit 1110, and may supplement a difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be located outside the core unit 1110 to further enforce a function to compensate a processing rate.

The bus interface 1130 may be a unit that may couple the core unit 1110 and the cache memory unit 1120 to efficiently transmit data.

The processor 1100 according to the embodiment of the present invention may include a plurality of core units 1110 and the core units 1110 may share the cache memory unit 1120. The core units 1110 and the cache memory unit 1120 may be coupled through the bus interface 1130. The core units 1110 may have the same configuration as the above-described core unit 1110. When the core units 1110 are provided, the primary storage unit 1121 of the cache memory unit 1120 may be disposed in each of the core units 1110 corresponding to the number of core units 1110, and one secondary storage unit 1122 and one tertiary storage unit 1123 may be disposed outside the core units 1110 so that the core units share the secondary and tertiary storage units through the bus interface 1130. Here, the processing rate of the primary storage unit 1121 may be greater than those of the secondary and tertiary storage units 1122 and 1123.

The processor 1100 according to the embodiment may further include an embedded memory unit 1140 that may store data, a communication module unit 1150 that may transmit and receive data to and from an external apparatus in a wired manner or a wireless manner, a memory control unit 1160 that may drive an external storage device, and a media processing unit 1170 that may process data processed in the processor 1100 or data input from an external input device, and may output a processing result to an external interface device. The processor may further include a plurality of modules other than the above-described components. The additional modules may transmit data to and receive data from the core unit 1110 and the cache memory unit 1120, and transmit and receive data therebetween, through the bus interface 1130.

The embedded memory unit 1140 may include a volatile memory as well as a nonvolatile memory. The volatile memory may include a dynamic random access memory (DRAM), a mobile DRAM, a static RAM (SRAM), or the like, and the nonvolatile memory may include a read only memory (ROM), a NOR flash memory, a NAND flash memory, a phase-change RAM (PCRAM), a resistance RAM (RRAM), a spin transfer torque RAM (STTRAM), a magnetic RAM (MRAM), or the like. The semiconductor device according to the embodiment may also be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, power line communication (PLC), or the like, and the wireless network module may include Infrared Data Association (IrDA) Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High. Speed Downlink Packet Access (HSDPA), Wideband CDMA (WCDMA), Ultra WideBand (UWB), or the like.

The memory control unit 1160 may be a unit that may manage data transmitted between the processor 1100 and an external storage apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCM-CIA), a USB, a secure digital (SD) card, a mini secure digital (mSD) card, a micro SD card, a secure digital high capacity (SDRC) card, a memory stick card, a smart media (SM) card, a multimedia card (MMC), an embedded MMC (eMMC), a compact flash (CF) card, or the like.

The media processing unit 1170 may be a unit that may process data processed in the processor 1100 or data input from an external input device, and may output a processing result to an external interface device so that the processing result may be transferred in video, sound, or other types. The media processing unit 1170 may include a GPU, a DSP, a HD audio, a high definition multimedia interface (HDMI) controller, or the like.

Figure 8:
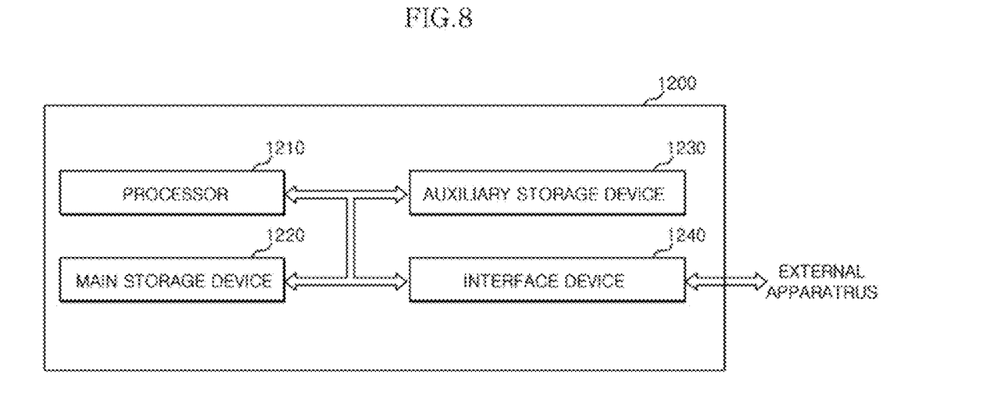
FIG. 8 is a block diagram illustrating a system according to an embodiment of the present invention.

As illustrated in FIG. 8, a system 1200 to which the semiconductor device according to an embodiment of the present invention is applied, is a data processing apparatus. The system 1200 may perform input, processing, output, communication, storage, and the like, to perform a series of operations on data, and include a processor 1210, a main storage device 1220, an auxiliary storage device 1230, and an interface device 1240. The system according to the embodiment may be a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing such as an operation and comparison of data stored in the system, and may include a MPU, a CPU, a single/multi core processor, a GPU, an AP, a DSP, or the like.

The main storage device 1220 is a storage area that may receive a program or data from the auxiliary storage device 1230 and execute the program or the data when the program is executed. The main storage device 1220 retains the stored contents even in power off, and may include the semiconductor device according to the above-described embodiment. The main storage device 1220 may have a structure in which a gate pick-up line is formed in a buffer layer without extension to the inside of a semiconductor substrate.

The main storage device 1220 according to the embodiment may further include an SRAM or a DRAM of a volatile memory type in which all contents are erased in power off. Alternatively, the main storage device 1220 may not include the semiconductor device according to the embodiment but may include an SRAM or a DRAM of a volatile memory type in which all contents are erased in power off.

The auxiliary storage device 1230 is a storage device that may store a program code or data. The auxiliary storage device 1230 may have a lower data processing rate than the main storage device 1220, but may store large amounts of data and include the semiconductor device according to the above-described embodiment. The auxiliary storage unit 1230 may have a structure in which a gate pick-up line is formed in a buffer layer without extension to the inside of a semiconductor substrate.

An area of the auxiliary storage device 1230 according to the embodiment may be reduced, to reduce a size of the system 1200 and increase portability of the system 1200. Further, the auxiliary storage device 1230 may further include a data storage system (not shown), such as a magnetic tape or a magnetic disc using a magnetism, a laser disc using light, a magneto-optical disc using a magnetism and light, an SSD, a USB memory, an SD card, an mSD card, a micro SD card, an SDHC card, a memory stick card, an SM card, an MMC, an eMMC, or a CF card. Alternatively, the auxiliary storage device 1230 may not include the semiconductor device according to the above-described embodiment but may include a data storage system (not shown), such as a magnetic tape or a magnetic disc using a magnetism, a laser disc using light, a magneto-optical disc using a magnetism and light, an SSD, a USB memory, an SD card, an mSD card, a micro SD card, an SDHC card, a memory stick card, an SM card, an MMC, an eMMC, or a CF card.

The interface device 1240 may exchange a command and data of an external apparatus with the system of the embodiment, and may be a keypad, a keyboard, a mouse, a speaker, a microphone, a display, a variety of Human Interface Devices (HIDs), or a communication device. The communication device may include all modules such as a module coupled to a wired network and a module coupled to a wireless network. The wired network module may include a LAN, a USB, Ethernet, PLC, or the like, and the wireless network module may include IrDA, CDMA, TDMA, FDMA, a wireless LAN, Zigbee, a USN, Bluetooth, RFID, LTE, NFC, Wibro, HSDPA, WCDMA, UWB, or the like.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor integrated circuit comprising:
a plurality of active pillars formed in a gate pick-up region;
buffer layers formed on the respective active pillars in the gate pick-up region;
gates each surrounding an outer circumference of the corresponding active pillar and the corresponding buffer layer; and
a gate pick-up line electrically coupled to the gates,
wherein the gate pick-up line is formed on the gates and the buffer layers.

2. The semiconductor integrated circuit of claim 1, wherein the gate pick-up line is formed to extend toward an inside of the buffer layer.

3. The semiconductor integrated circuit of claim 1, further comprising gate insulating layers each formed between the respective active pillars and the respective gates.

4. The semiconductor integrated circuit of claim 1, wherein adjacent buffer layers are insulated from each other.

\* \* \* \* \*